United States Patent [19]

Seidler

[11] 4,266,840
[45] May 12, 1981

[54] CIRCUIT HOLDER

[76] Inventor: Jack Seidler, 59-40 15th St., Flushing, N.Y. 11357

[21] Appl. No.: 89,021

[22] Filed: Oct. 29, 1979

[51] Int. Cl.³ .......................................... H01R 13/639
[52] U.S. Cl. ................................................. 339/75 M
[58] Field of Search ............... 174/52 FP; 339/17 CF, 339/75 R, 75 M, 75 MP

[56] References Cited

U.S. PATENT DOCUMENTS 3,883,207  5/1975  Tomkiewicz ...................... 339/75 M
4,189,199  2/1980  Grau ................................ 339/75 MP Primary Examiner—John McQuade
Attorney, Agent, or Firm—DeLio and Montgomery

[57] ABSTRACT

A circuit holder wherein an integrated circuit module having downwardly projecting straight terminals can be mounted on a base with zero insertion force at the terminals, the contacts in the base being forced into engagement with the circuit terminals by means of a normally arched deformable plate which is flattened as the elements are assembled and is snap-locked in its assembled position.

5 Claims, 5 Drawing Figures

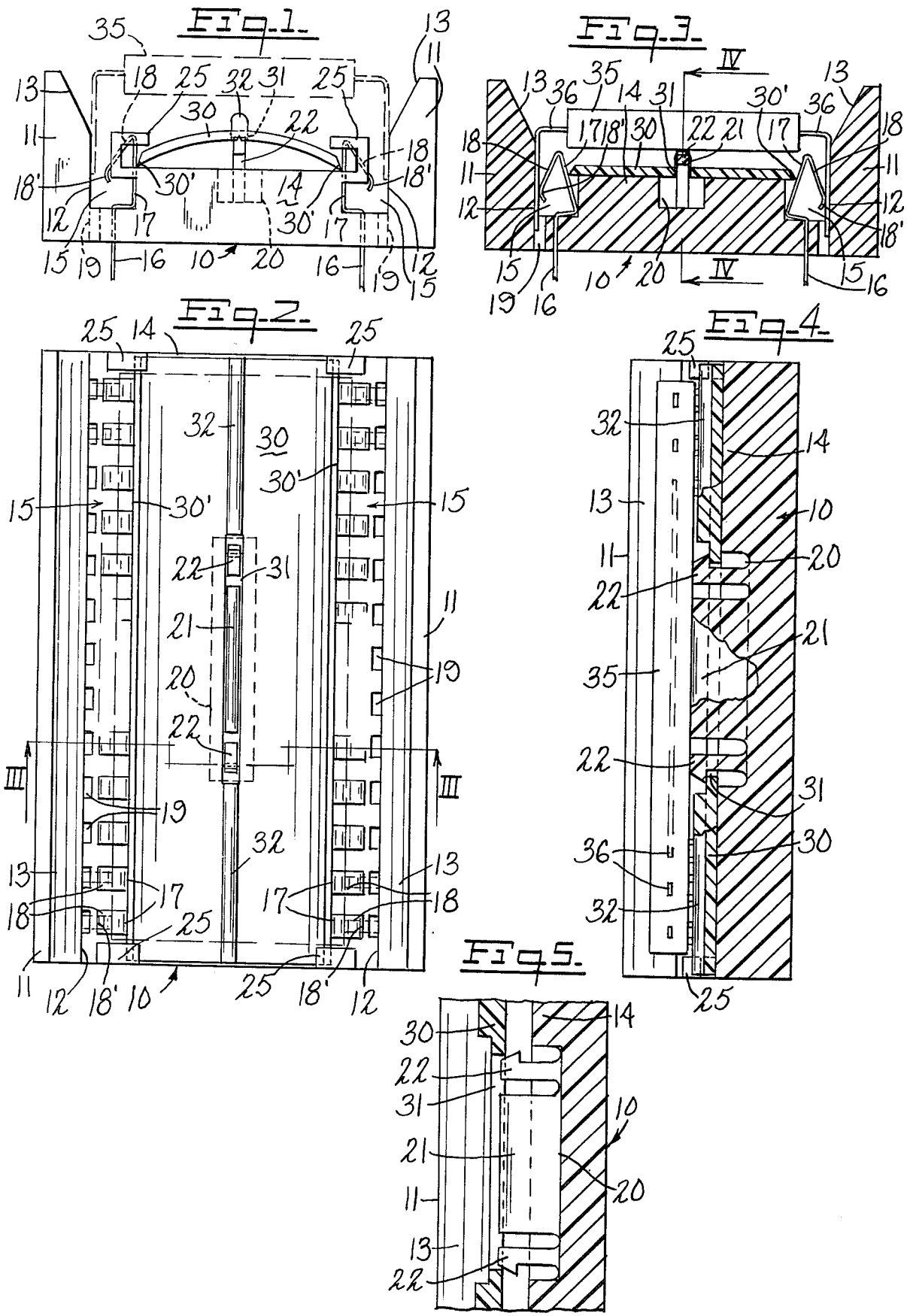

CIRCUIT HOLDER

This invention relates to a circuit holder wherein an integrated circuit module having downwardly projecting straight terminals can be mounted on a base with zero insertion force at the terminals, the contacts in the base forced into engagement with the circuit terminals by means of a normally arched deformable plate which is flattened as the elements are assembled and is snap-locked in its assembled position.

In the small electrical devices with which this invention is concerned, the various terminals and connectors have very limited contact areas, so that different expedients have been resorted to in order to ensure electrical integrity. A wiping contact is provided for in the connecting means shown by Pauza et al., U.S. Pat. No. 3,753,211 and in Dennis et al., U.S. Pat. No. 3,993,384; resilient or elastomeric materials are used by Anhalt et al., U.S. Pat. No. 3,900,239, and by Cutchaw, U.S. Pat. No. 3,997,227. Cherian et al., U.S. Pat. No. 4,080,032, shows normally closed contacts which can be cammed open to provide zero insertion force, while Mouissie, U.S. Pat. No. 4,054,347, shows spaced contacts which can be closed by a sliding toggle arrangement or by a rotatable cam.

It is an object of the present invention to provide a simpler means for positively closing and locking an open contact, actuated by the movement of the circuit element toward the base while the projecting terminals are subjected to zero insertion force.

It is a further object of the invention to provide a circuit holder wherein the movement of the circuit element toward the base culminates in the automatic snap locking of the arched locking plate in its flat position, with edges frictionally engaging the contacts.

It is another object of the invention to provide a molded plastic locking plate which can be pre-assembled with the base in an inactive position and retained there during shipment or storage until activated by the forceful addition of an integrated circuit element.

The invention accordingly comprises an article of manufacture possessing the features, properties, and the relation of elements which will be exemplified in the constructions hereinafter set forth, and the scope of the invention will be indicated in the claims.

A practical embodiment of the invention is shown in the accompanying drawing wherein:

FIG. 1 represents an end view of the base and locking plate, in unlocked position, an integrated circuit element being shown in broken lines;

FIG. 2 represents a top plan view of the assembled locking plate and base, as in FIG. 1;

FIG. 3 represents a transverse section on the line III—III of FIG. 2;

FIG. 4 represents a longitudinal section on the line IV—IV of FIG. 3; and

FIG. 5 represents a detail longitudinal section as in FIG. 4, but with the parts in unlocked position as in FIGS. 1 and 2.

Referring to the drawing, the base 10 on which a selected integrated circuit is to be mounted, is shown as an elongated body having upstanding side walls 11, each having a flat vertical portion 12 and a beveled upper portion 13. An elongated central platform 14 extends lengthwise of the base, its side walls forming, with the vertical walls 12, spaced channels 15.

Oppositely facing arrays of contacts 16 project upward from the floor of the channels, each contact having a straight vertical portion 17 which rests normally against the inner channel wall and a leg 18 projecting outwardly and downwardly and terminating in a rounded contact surface 18', normally spaced from the other channel wall, as shown in FIG. 1. Adjacent each contact 16 the channel floor is perforated as shown at 19 to receive the end of a circuit terminal.

Centrally the base is provided with an elongated rectangular well 20 from the middle of which a rectangular fin 21 rises to a level slightly above that of the base upper surface, and adjacent each end of the fin the locking hooks 22 project freely upward about the same distance from the floor of the well with their hooks facing away from the fin. At each end, the platform 14 is provided with pairs of upstanding ears 25, the upper portions of which project toward each other (FIG. 1) for a purpose explained below.

It is evident that downwardly projecting terminals of a typical integrated circuit module can be introduced into the channels 15 with zero insertion force, but the terminals do not initially engage any contacts, as shown in FIG. 1. The activating element of the circuit holder is the longitudinally arched plate 30, of resilient plastic material, shown at rest in FIG. 1, with its feather edges 30' resting against the portions 17 of the contacts. The plate 30 is provided with a central slot 31, slightly shorter than the well 20, and with upwardly projecting longitudinal ribs 32, aligned with the slot. The plate is retained in its inactive position (FIG. 1) by the ears 25 which extend over the four corners of the plate and by the fin 21 and hooks 22, projecting slightly into the slot 31 (FIG. 5) to prevent the plate from getting out of position with its corners under the ears.

When an integrated circuit module 35 is to be mounted on such a base, with its terminals 36 engaging the contacts 16, it is simply pressed down on its base from the broken line position of FIG. 1 to the full line position in FIGS. 2, 3 and 4, such pressure causing the plate 30 to be flattened so that its edges push the resilient contacts out to bring their surfaces 18' into wiping or static engagement with the terminals, and the hooks 22 (with beveled noses) snap into locking engagement with the ends of the slot 31, as shown in FIG. 4. The integrated circuit is held on the base by the frictional engagement of its multiplicity of terminals with their respective resilient contacts, but it can be removed by the exercise of sufficient force to overcome the friction. With the circuit mode removed, the base can be prepared to receive another circuit, if desired for any reason, by releasing the hooks 22 so that the plate can resume its arched form, thus releasing the contacts as in FIG. 1.

The base is shown as having two oppositely facing arrays of contacts with the plate extending between them. If either set of contents were omitted and replaced by a fixed or resilient stop, the plate could still function as described with respect to the remaining contacts.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawing shall be interpreted as illustrative and not in a limiting sense.

What I claim is:

1. A holder for an integrated circuit module comprising a base having spaced parallel channels adapted to receive the terminals of an integrated circuit module, an elongated central platform extending between said channels, arrays of resilient contacts in each channel normally resting out of the path of circuit terminals to be held, a separate arched plate of resilient material having opposite parallel edges resting on said platform and disposed adjacent said arrays of contacts, means for locking the plate in flattened position, the plate being so proportioned that it transition from arched to flattened causes said edges to project into respective channels and thereby push the contacts into terminal engaging position.

2. A holder for an integrated circuit module according to claim 1 wherein the plate is provided with an aperture and the plate locking means comprises snap hooks projecting upward from the central platform and engageable in the aperture in the plate.

3. A holder for an integrated circuit module to claim 1 wherein the plate is adapted to be flattened by downward pressure of the module.

4. A holder for an integrated circuit module according to claim 1 wherein the base is provided with plate retaining elements and with means for preventing the plate from moving out of register with said elements.

5. A holder for an integrated circuit module according to claim 1 wherein the resilient contacts comprise a vertical portion and a second portion projecting outwardly and downwardly.

* * * * *

UNITED STATES PATENT AND TRADEMARK OFFICE
CERTIFICATE OF CORRECTION

PATENT NO. : 4,266,840
DATED : May 12, 1981
INVENTOR(S) : Jack Seidler

It is certified that error appears in the above-identified patent and that said Letters Patent are hereby corrected as shown below:

Column 1, line 8 - "base forced" should read "base being forced".

Column 2, line 50 - "circuit mode" should read "circuit module".

Column 4, line 6 - "module to claim" should read "module according to claim".

Signed and Sealed this

Fourth Day of August 1981

[SEAL]

Attest:

GERALD J. MOSSINGHOFF

Attesting Officer  Commissioner of Patents and Trademarks